(12) United States Patent
Weiss et al.

(10) Patent No.: US 11,094,866 B2
(45) Date of Patent: Aug. 17, 2021

(54) METHOD FOR PRODUCING AN OPTOELECTRONIC COMPONENT, AND OPTOELECTRONIC COMPONENT

(71) Applicant: OSRAM OLED GMBH, Regensburg (DE)

(72) Inventors: Guido Weiss, Pielenhofen (DE); Christoph Schwarzmaier, Regensburg (DE); Dominik Scholz, Bad Abbach (DE); Nicole Heitzer, Brennberg (DE)

(73) Assignee: OSRAM OLED GMBH, Regensburg (DE)

( * ) Notice: Subject to any disclaimer, the term of this patent is extended or adjusted under 35 U.S.C. 154(b) by 92 days.

(21) Appl. No.: 16/495,219

(22) PCT Filed: Mar. 20, 2018

(86) PCT No.: PCT/EP2018/057049
§ 371 (c)(1),
(2) Date: Sep. 18, 2019

(87) PCT Pub. No.: WO2018/172368
PCT Pub. Date: Sep. 27, 2018

(65) Prior Publication Data
US 2020/0028045 A1 Jan. 23, 2020

(30) Foreign Application Priority Data
Mar. 24, 2017 (DE) .......................... 102017106410.9

(51) Int. Cl.
*H01L 33/62* (2010.01)
*H01L 23/00* (2006.01)
(Continued)

(52) U.S. Cl.
CPC .............. *H01L 33/62* (2013.01); *C25D 7/123* (2013.01); *H01L 24/11* (2013.01); *H01L 24/13* (2013.01);
(Continued)

(58) Field of Classification Search
None
See application file for complete search history.

(56) References Cited

U.S. PATENT DOCUMENTS 8,975,175 B1 3/2015 Pass
9,041,020 B2 5/2015 Herrmann et al.
(Continued)

FOREIGN PATENT DOCUMENTS

DE 102010045390 A1 3/2012

*Primary Examiner* — Robert K Carpenter
(74) *Attorney, Agent, or Firm* — Slater Matsil, LLP

(57) ABSTRACT

A method for producing an optoelectronic component and an optoelectronic component are disclosed. In an embodiment a method includes providing a semiconductor chip having an active region for radiation emission, applying a seed layer on the semiconductor chip, wherein the seed layer includes a first metal and a second metal being different from the first metal, and wherein the second metal is less noble than the first metal, applying a structured photoresist layer directly to the seed layer and applying a solder layer at least to regions of the seed layer which are not covered by the photoresist layer, wherein a ratio of the first metal to the second metal in the seed layer is between 95:5 to 99:1.

15 Claims, 6 Drawing Sheets

(51) Int. Cl.
*H01L 33/60* (2010.01)
*C25D 7/12* (2006.01)
(52) U.S. Cl.
CPC ...... *H01L 33/60* (2013.01); *H01L 2224/1147* (2013.01); *H01L 2224/11462* (2013.01); *H01L 2224/13082* (2013.01); *H01L 2224/13166* (2013.01); *H01L 2224/13211* (2013.01); *H01L 2224/13218* (2013.01); *H01L 2224/13224* (2013.01); *H01L 2224/13239* (2013.01); *H01L 2224/13244* (2013.01); *H01L 2224/13247* (2013.01); *H01L 2224/13269* (2013.01); *H01L 2924/0103* (2013.01); *H01L 2924/014* (2013.01); *H01L 2924/0105* (2013.01); *H01L 2924/01013* (2013.01); *H01L 2924/01029* (2013.01); *H01L 2924/01047* (2013.01); *H01L 2924/01078* (2013.01); *H01L 2924/01079* (2013.01); *H01L 2933/0058* (2013.01); *H01L 2933/0066* (2013.01)

(56) References Cited

U.S. PATENT DOCUMENTS

| | | |
|---|---|---|
| 2002/0076925 A1 | 6/2002 | Marieb et al. |
| 2009/0218694 A1 | 9/2009 | Kato et al. |
| 2009/0283787 A1 | 11/2009 | Donofrio et al. |
| 2013/0313594 A1 | 11/2013 | Han et al. |
| 2016/0111615 A1 | 4/2016 | von Malm et al. |
| 2016/0163663 A1 | 6/2016 | Kim et al. |
| 2020/0044118 A1* | 2/2020 | Weiss ................. H01L 33/46 |

* cited by examiner

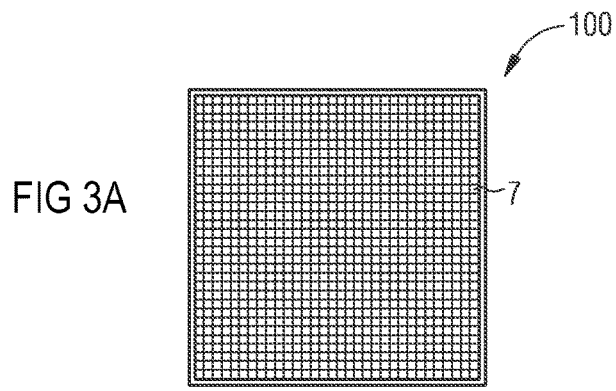
FIG 3A
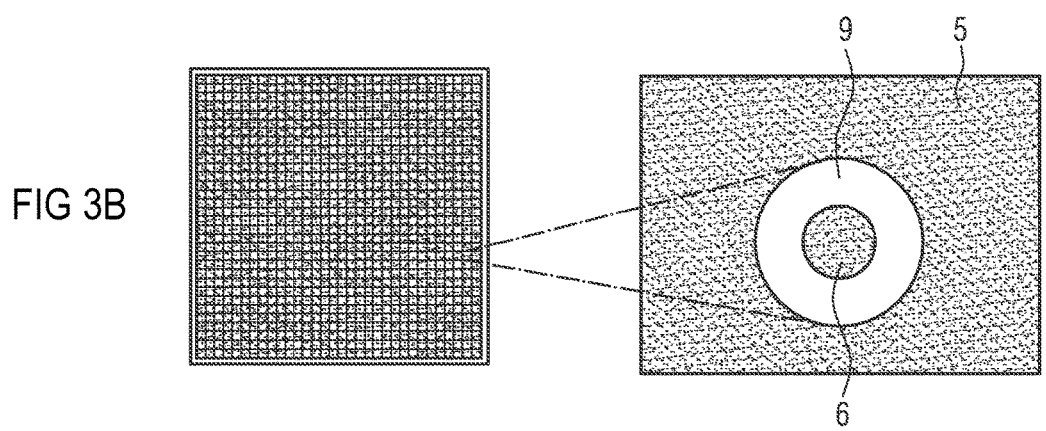
FIG 3B
FIG 3C
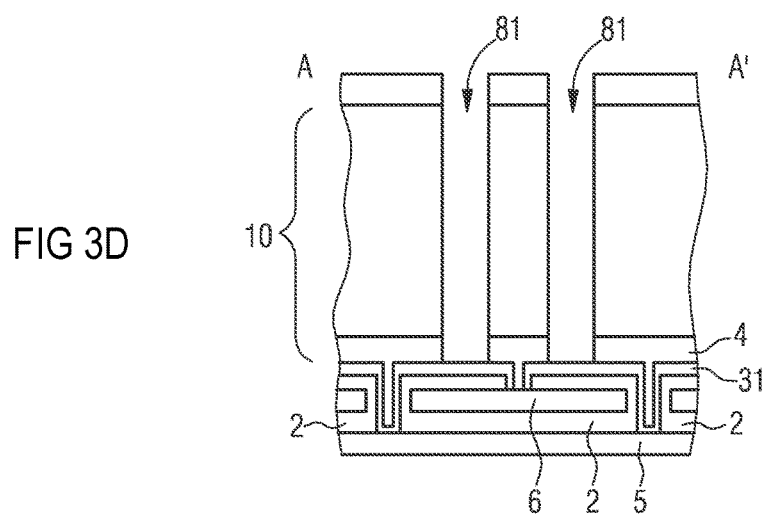
FIG 3D

METHOD FOR PRODUCING AN OPTOELECTRONIC COMPONENT, AND OPTOELECTRONIC COMPONENT

This patent application is a national phase filing under section 371 of PCT/EP2018/057049, filed Mar. 20, 2018, which claims the priority of German patent application 102017106410.9, filed Mar. 24, 2017, each of which is incorporated herein by reference in its entirety.

TECHNICAL FIELD

The invention refers to a method for producing an optoelectronic component. Furthermore, the invention refers to an optoelectronic component.

BACKGROUND

In order to galvanically deposit a metal of a solder layer, for example, of gold, a seed layer of gold is required for growth. The solder layer can be applied in a structured manner by means of phototechnology. This requires a thin silicon nitride layer as an adhesion promoter, which is applied between the seed layer and a photoresist layer in order to allow sufficient adhesion of the photoresist layer to the seed layer. However, the adhesion promoter made of silicon nitride must be opened and removed before the electroplating. A plasma method is usually used to remove the adhesion promoter. However, the etching results of this plasma method are not reproducibly good, so that the adhesion promoter remains in the component at least partially.

SUMMARY OF THE INVENTION

Embodiments provide an improved optoelectronic component. In particular, the disadvantages described above are to be overcome. Further embodiments provide an improved method for producing an optoelectronic component.

In at least one embodiment, the method for producing an optoelectronic component comprises the method steps:

A) providing a semiconductor chip having an active region formed for radiation emission, B) applying a seed layer on the semiconductor chip, wherein the seed layer has a first metal and a second metal being different from the first metal, wherein the second metal is less noble than the first metal, C) applying a structured photoresist layer directly to the seed layer; and D) applying a solder layer at least to regions of the seed layer which are not covered by the photoresist layer, wherein the ratio of first metal to second metal is between 95:5 to 99:1 in the seed layer (4).

In various embodiments, the inventors have recognized that the method described here eliminates the need for a thin adhesion layer, in particular of silicon nitride, which serves as an adhesion promoter between the photoresist layer and the seed layer. The costly removal of the adhesion promoter, for example, by means of a plasma method, is avoided. This saves time, material and costs. In addition, this method has a higher yield gain, a method simplification and a cost reduction through method savings.

Preferably, the method is carried out in the order indicated in the method steps.

According to at least one embodiment, the method has a step A): providing a semiconductor chip. The semiconductor chip has an active region. The active region is formed as radiation emission.

According to at least one embodiment, the semiconductor chip has at least one semiconductor layer sequence. The semiconductor layer sequence preferably has a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein $0 \le n \le 1$, $0 \le m \le 1$ and $n+m \le 1$, respectively. The semiconductor layer sequence can have dopants as well as additional components. For the sake of simplicity, however, only the essential components of the crystal lattice of the semiconductor layer sequence, i.e., Al, As, Ga, In, N or P, are given, even if these may be partially replaced and/or supplemented by small quantities of other substances.

The semiconductor layer sequence includes an active region with at least one pn-junction and/or with one or more quantum well structures. During operation of the semiconductor chip, electromagnetic radiation is generated in the active region. A wavelength of radiation is preferably in the ultraviolet and/or visible range, particularly at wavelengths between 420 nm and 680 nm inclusive, for example, between 440 nm and 480 nm inclusive.

According to at least one embodiment, the semiconductor chip is a light-emitting diode, LED for short. The semiconductor layer sequence is then preferably formed to emit blue light. The component is preferably formed to emit white, blue, red or green light.

In addition to the semiconductor layer sequence, the semiconductor chip can also have contacts. In particular, the semiconductor chip has p- and n-contacts. The contacts are formed to electrically contact the corresponding semiconductor layer sequences, i.e., the n-doped semiconductor layer and the p-doped semiconductor layer, to the outside. The contacts can be arranged between the semiconductor layer sequence and the seed layer.

According to at least one embodiment, the method has an additional method step: Removal of the photoresist layer by means of a lift-off method. This method step is preferably carried out after step D).

The photoresist layer is used in particular for masking in order to enable a structured application of the solder layer. The photoresist layer does not remain, in particular in the finished component. Therefore, this photoresist layer must be removed.

According to at least one embodiment, the method has an additional method step: Removal of the regions of the seed layer which are not or were not covered by the photoresist layer. The removal can be carried out by wet chemical etching, for example, with a potassium cyanide solution.

In particular, this method step takes place after the photoresist layer has been removed. The seed layer can be removed in particular between the regions of the structured solder layer. Thus, a structured seed layer can be generated.

According to at least one of the forms, the method has a step B): Applying a seed layer to the semiconductor chip. In particular, the seed layer is applied directly to the semiconductor chip. "Directly" means here direct such that no further elements and/or layers are arranged between the seed layer and the semiconductor chip. Alternatively, the seed layer can be arranged on the semiconductor chip also indirectly, this is to say indirect.

According to at least one embodiment, the component has a seed layer. The seed layer has a first metal. The first metal can be gold, silver, platinum or copper.

According to at least one embodiment, the seed layer has a second metal being different from the first metal. The second metal is less noble than the first metal. The second metal is preferably zinc, tin or aluminum.

In this case, less noble can mean that the second metal has a negative standard potential with respect to the standard hydrogen electrode. Under normal conditions, base metals such as zinc react with oxygen from the air to form zinc oxide, i.e., they oxidize. Aluminum can also oxidize to aluminum oxide and thus form a corrosion resistant oxide layer which prevents further oxidation. The fact that the second metal is less noble than the first metal can also mean that the second metal has a smaller standard potential than the first metal. The standard potentials $E_o$ in volts of the corresponding metals are shown in the following table.

| Red. | Ox, | +n e$^-$ | Standardpotential $E_o$ (Volt) |
|---|---|---|---|
| Na | Na$^+$ | +1 e$^-$ | −2.714 |
| Mg | Mg$^{2+}$ | +2 e$^-$ | −2.363 |
| Al | Al$^{3+}$ | +3 e$^-$ | −1.662 |
| Zn | Zn$^{2+}$ | +2 e$^-$ | −0.763 |
| Cr | Cr$^{3+}$ | +3 e$^-$ | −0.744 |
| Fe | Fe$^{2+}$ | +2 e$^-$ | −0.400 |
| Cd | Cd$^{2+}$ | +2 e$^-$ | −0.403 |
| Sn | Sn$^{2+}$ | +2 e$^-$ | −0.136 |
| Pb | Pb$^{2+}$ | +2 e$^-$ | −0.126 |
| H$_2$ | 2H$^+$ | +2 e$^-$ | 0.000 |
| Cu | Cu$^{2+}$ | +2 e$^-$ | +0.337 |
| Ag | Ag$^+$ | +1 e$^-$ | +0.799 |
| Hg | Hg$^{2+}$ | +2 e$^-$ | +0.854 |
| Pt | Pt$^{2+}$ | +2 e$^-$ | +1.200 |
| Au | Au$^{3+}$ | +3 e$^-$ | +1.498 |

The standard potentials are measured under standard conditions at 25° C. and 1.013 bar in a 1-molar solution.

According to at least one embodiment, the first metal is gold and the second metal is zinc in the seed layer.

According to at least one embodiment, the proportion of the second metal is between 0.5 wt % and 10 wt %, in particular between 1 wt % and 4 wt %, particularly preferred between 2 wt % and 3.5 wt %, for example, 3 wt %. The second metal is preferably zinc.

According to at least one embodiment the seed layer is tempered. For example, tempering can take place at a temperature between room temperature and 350° C., for example, between 50° C. and 300° C., for example, between 150° C. and 250° C., for example, at 200° C. This allows the second metal, in particular zinc, to diffuse to the surface of the seed layer and oxidize to zinc oxide as the case may be. Thus, the seed layer also assumes the function of an adhesion promoting layer, i.e., it promotes the photoresist layer to adhere to the seed layer. An additional adhesion promoting layer or adhesion layer, for example, of silicon nitride, which was previously required to bond the photoresist layer to a gold seed layer, is no longer required here.

Zinc diffuses onto the surface of the seed layer, in particular as a result of tempering.

According to at least one embodiment, the ratio of the first metal to the second metal is between 95:5 and 99:3, in particular 98:2, in particular 97:3, in the seed layer.

According to at least one embodiment, the seed layer has a layer thickness between 50 nm and 5000 nm, in particular between 100 nm and 500 nm, particularly preferably between 150 nm and 350 nm, for example, 200 nm.

According to at least one embodiment, the region between the photoresist layer and the seed layer is free of an adhesion promoter layer. In particular, the lateral region between two structured regions of the solder layer is free of a nitride layer, preferably silicon nitride, for adhesion promotion.

The inventors have recognized that by the special composition of the seed layer, in particular by adding the second metal, such as zinc, into the seed layer, it is possible to dispense with a further adhesion layer for bonding the photoresist layer. This saves method costs, material and time.

According to at least one embodiment, the seed layer is formed reflective for the radiation generated in the active region.

According to at least one embodiment, the solder layer has a metal. The solder layer can also have more than one metal, for example, two or three metals. The metals can be present here as a mixture, for example, as a eutectic mixture, or as a layer sequence. Preferably the solder layer has a layer sequence of gold and a subsequent tin layer. The solder layer can be galvanically deposited. The solder layer has in particular gold. The solder layer can have several sublayers. After deposition of the first sublayer with a metal, another sublayer can be deposited with another metal, which is also part of the solder layer. For example, tin can be deposited on the gold layer of the solder layer.

According to at least one embodiment, the solder layer has a metal that is galvanically deposited and corresponds to the first metal of the seed layer. In other words, the solder layer and the seed layer have the same first metal. Preferably the first metal is gold. In particular, the second metal of the seed layer is not part of the solder layer.

According to at least one embodiment, the component is formed to be installed in an adaptive headlamp. In particular, the adaptive headlamp is an adaptive front headlamp. Adaptive headlamps, e.g., for vehicles, are headlamps whose lighting intensity and direction can be adapted to the driving condition and the traffic situation so that the road can be optimally illuminated.

According to at least one embodiment, the component has a plurality of light generating regions having a p- and an n-contact. In addition, the light generation regions can be arranged in a matrix. The light generation regions are preferably arranged on sides being opposite the solder layer, thus forming the main radiation exit surface of the semiconductor chip.

According to at least one embodiment, the seed layer is free of titanium. The inventors have recognized that by using the seed layer described here, it is possible to dispense with an adhesion promoter, in particular of silicon nitride, and/or an adhesion layer, in particular made of titanium. This eliminates the need for a galvanic plasma method to selectively remove titanium or silicon nitride, for example, after a seed layer has been applied. In addition, short circuits can be avoided by not completely removing the titanium, which is no longer needed here. This leads to a yield gain, method simplification and cost savings through method step savings.

Embodiments provide an optoelectronic component. Preferably, the optoelectronic component is produced using the method described here. All the embodiments and definitions of the method for producing the optoelectronic component also apply to the optoelectronic component and vice versa.

According to at least one embodiment, the optoelectronic component has a semiconductor chip with an active region. The active region is formed for radiation emission. The component has a structured seed layer. The seed layer has of a first metal and a second metal being different from the first metal. The second metal is less noble than the first metal. The seed layer is arranged directly or indirectly on the semiconductor chip. The component has a solder layer arranged directly on the seed layer, wherein the ratio of first metal to second metal is between 95:5 to 99:1 in the seed layer (4).

According to at least one embodiment, the solder layer is applied in a structured manner. Structured means here and in the following that the solder layer and/or seed layer and/or photoresist layer are not applied to the entire surface of the semiconductor chip, but that regions of the corresponding layers are generated, which are laterally and spatially spaced from one another as seen in the lateral cross-section.

According to at least one embodiment, the solder layer has the first metal.

According to at least one embodiment, the solder layer has tin in addition to the first metal.

BRIEF DESCRIPTION OF THE DRAWINGS

Further advantages, advantageous embodiments and further developments result from the exemplary embodiments described in the following in connection with the figures.

They show:

FIGS. 3A to 3D show schematic top views or side views of an optoelectronic component according to an embodiment;

In the exemplary embodiments and figures, same or similar and similar acting elements can each be labeled with the same reference signs. The elements shown and their size ratio are not to be regarded as true to scale. Rather, individual elements, such as layers, components, devices and regions, can be displayed exaggeratedly large for better representability and/or better understanding.

DETAILED DESCRIPTION OF ILLUSTRATIVE EMBODIMENTS

FIGS. 1A to 1E show a method for producing an optoelectronic component according to an embodiment.

Figure 1A:
FIGS. 1A to 1E show methods for producing an optoelectronic component.
Figure 1B:
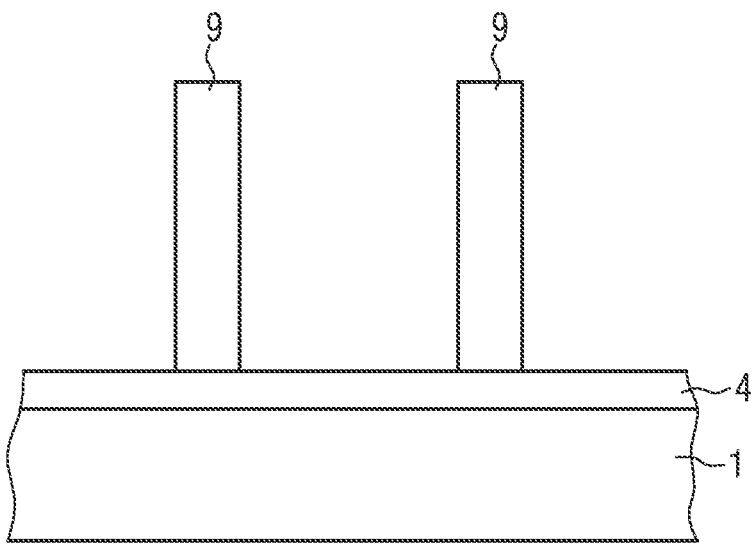

As shown in FIG. 1A, a semiconductor chip 1 is provided. For example, the semiconductor chip 1 is a gallium nitride semiconductor chip. A seed layer 4 can be applied to this semiconductor chip 1, in particular over the entire surface (FIG. 1B). As shown in FIG. 1B, a photoresist layer 9 can be applied to this seed layer 4 in a structured manner. The photoresist layer 9 is preferably applied directly to the seed layer 4. The photoresist can be a positive, negative or reverse resist. For example, AZ 15 nXT can be used as a photoresist. The seed layer 4 has a first metal, for example gold, and a second metal being different from the first metal, for example, zinc. The proportion of the first metal to the second metal is preferably 97:3.

Figure 1C:
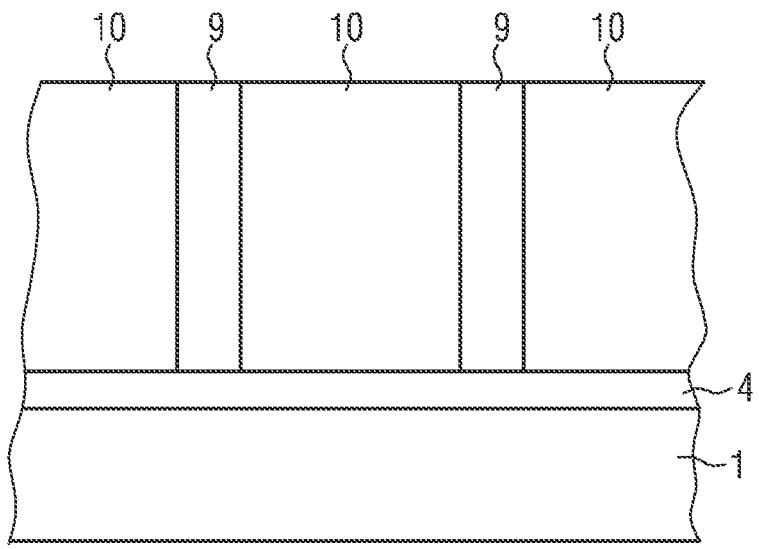

Subsequently, as shown in FIG. 1C, the solder layer 10 can be applied at least to regions of the seed layer 4 that are not covered by photoresist layer 9. In other words, the photoresist layer 9 here serves as a mask, wherein the solder layer 10 is applied between the regions not covered by the mask. The solder layer 10 is arranged laterally to the structured photoresist layer 9.

Figure 1D:
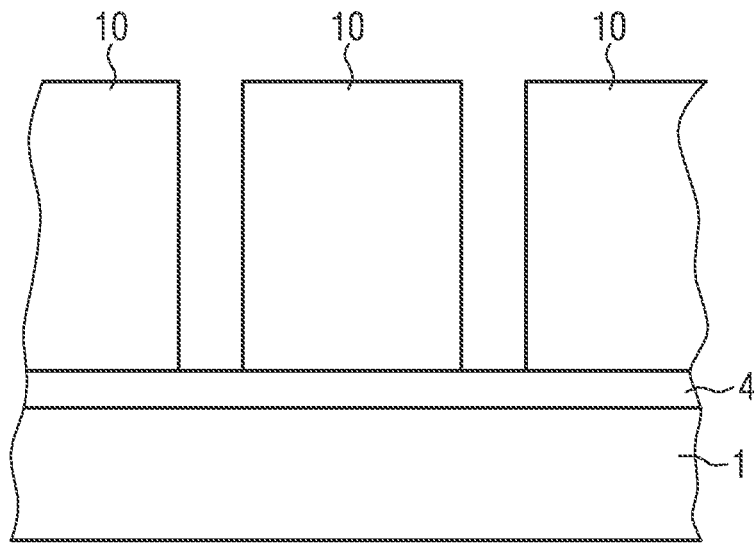
Figure 1E:
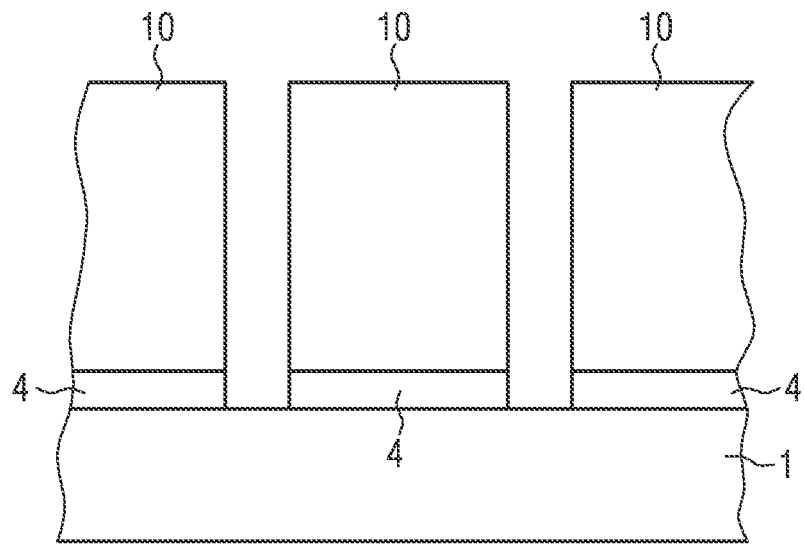

Subsequently, as shown in FIG. 1D, the photoresist layer 9 can be removed again. The photoresist layers 9 can be removed using a lift-off method. Subsequently, regions of the seed layer 4 can be removed, which were covered by the photoresist layer 9. The removal of the seed layer 4, in particular in the regions between the structured regions of the solder layer 10, can be removed by wet chemical etching (FIG. 1E). Preferably the seed layer 4 is completely removed in these regions in order to avoid a short circuit.

Figure 2A:
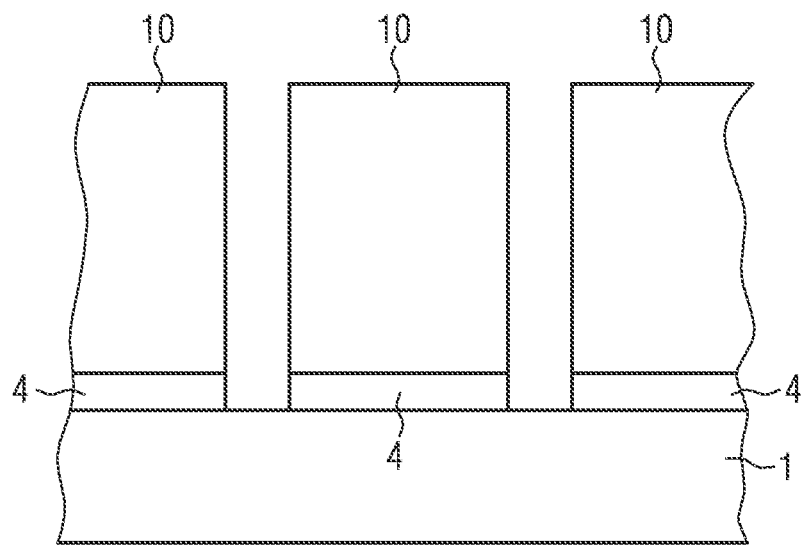
FIGS. 2A and 2B show schematic side views of an optoelectronic component according to an embodiment.
Figure 2B:
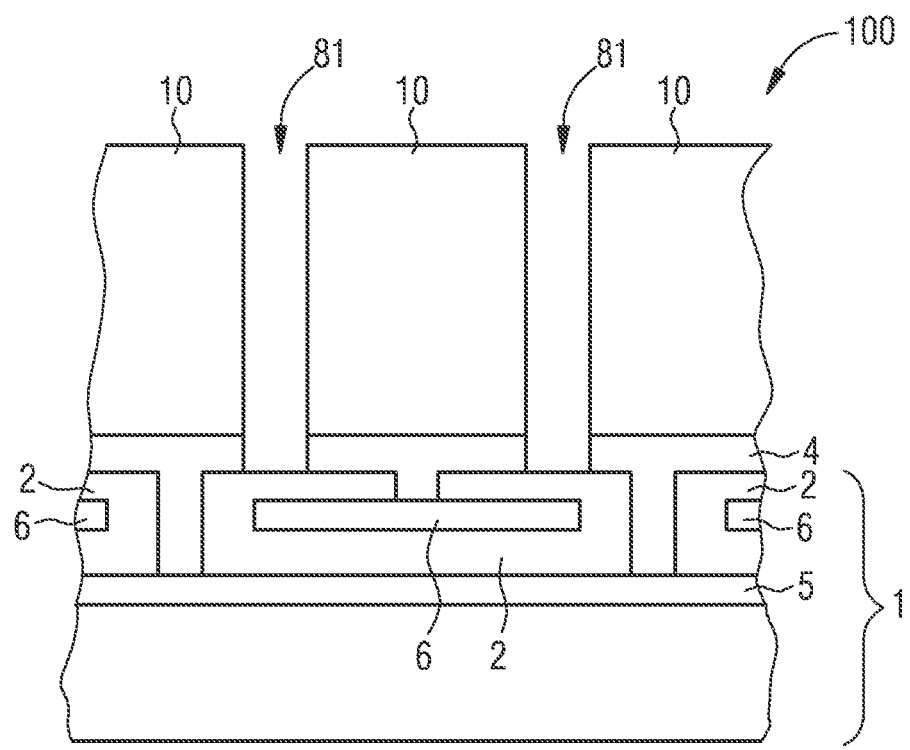

FIGS. 2A and 2B each show a schematic side view of an optoelectronic component according to an embodiment. The component has a semiconductor chip 1. A preferably structured seed layer 4 is arranged on the semiconductor chip. The seed layer 4 is followed directly by the solder layer 10. The solder layer 10 is preferably formed from a layer sequence, for example, gold and tin (not shown here).

The component of FIG. 2B differs from the component of FIG. 2A in that here the contacts 5, 6 of the semiconductor chip 1, in particular the n-contact 5 and p-contact 6 of the semiconductor chip are shown. Both contacts 5, 6 are electrically separated from one another by a dielectric layer 6, for example, of silicon dioxide, in order to avoid a short circuit. The component in FIG. 2B also has deepenings or recesses 81. The deepenings were created as a result of the removal of the photoresist layer 9 during production.

The FIGS. 3A to 3D show a schematic top view or side view of an optoelectronic component 100 according to an embodiment.

FIG. 3A shows the component with a large number of light generation regions 7. Here, the light generation regions 7 are arranged in a matrix. FIG. 3A also shows the semiconductor layer sequence or the front side of the semiconductor chip 1, i.e., the side through which the radiation is emitted.

FIG. 3B shows the back side of the semiconductor chip 1. The solder layer 10 can be applied galvanically to this back side of the semiconductor chip 1.

FIG. 3C shows a cutout of the backside of the semiconductor chip 1. The n-contact 5 and the p-contact 6 are shown. These two contacts are spatially and electrically separated from one another. The photoresist layer 9 is also shown. This photoresist layer 9 is removed again in a subsequent method step.

The FIG. 3D shows the schematic side view of an optoelectronic component according to an embodiment. In comparison to the component of FIG. 2B, the component of FIG. 3D also shows an adhesion layer 31. The adhesion layer 31, for example, can be made of titanium. The adhesion layer 31 can also be missing.

Figure 4A:
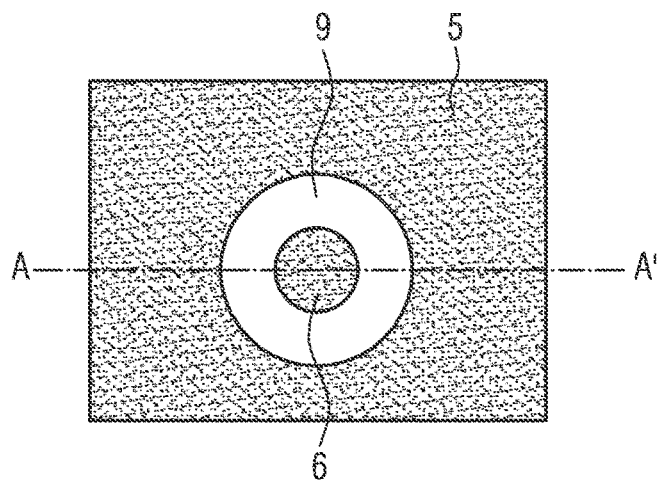
FIGS. 4A to 4C show schematic top views or side views of an optoelectronic component according to an embodiment or according to an example of comparison.
Figure 4B:
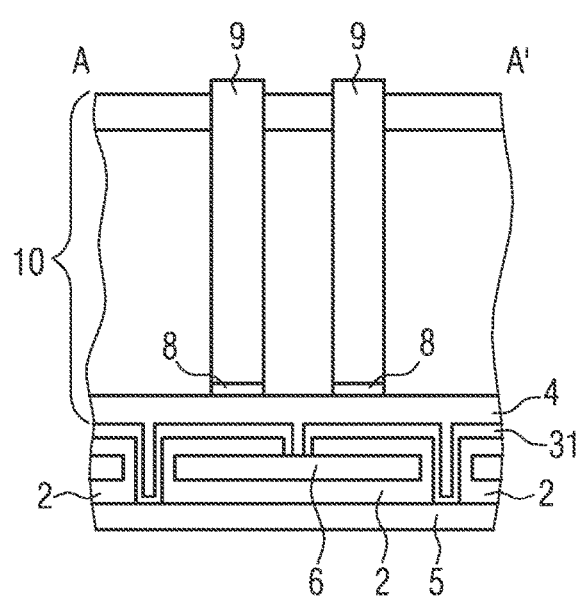
Figure 4C:
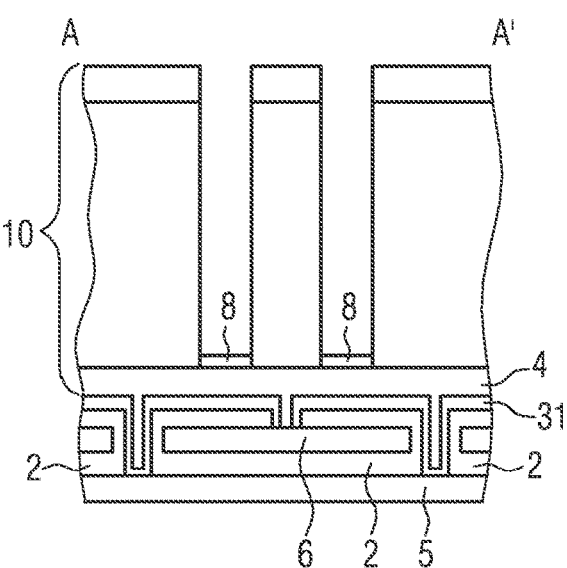

FIGS. 4A to 4C show a schematic top view or side views of a component according to examples of comparison. FIGS. 4B and 4C each show a sectional view of AA', as shown in FIG. 4A. Here a second dielectric layer 8, in particular of silicon nitride, is used to enable the photoresist layers 9 to adhere to the seed layer 4. The inventors have now found out that such a second dielectric layer 8 can be completely dispensed with if the seed layer 4 described here, in particular of gold and zinc, is used.

Figure 5A:
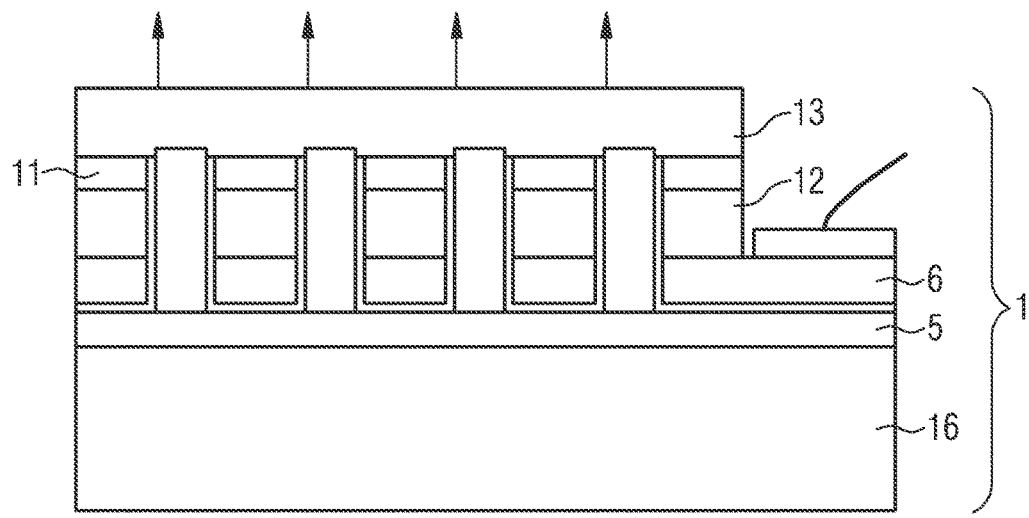
FIGS. 5A and 5B show semiconductor chips according to an embodiment.
Figure 5B:
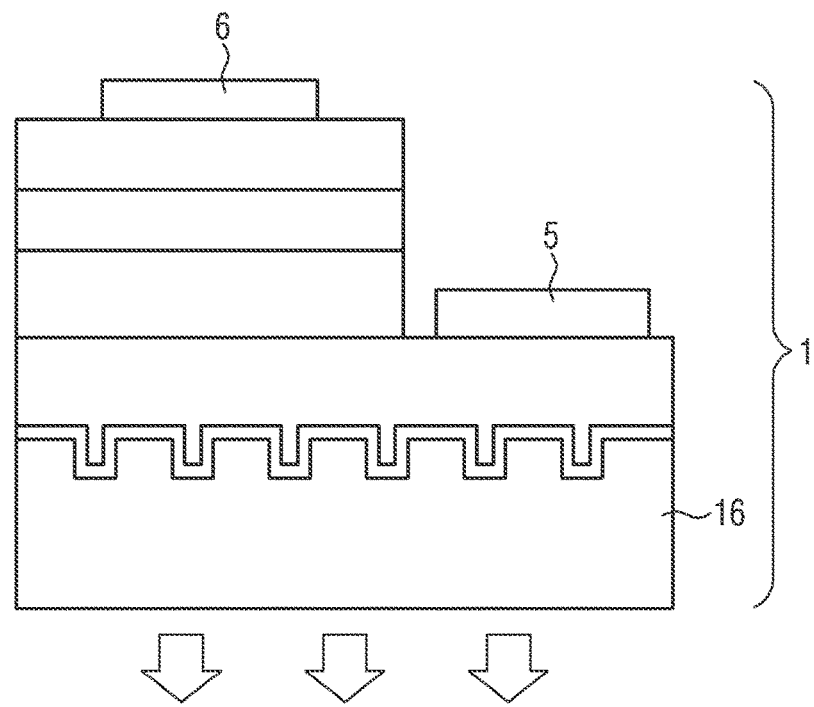

FIGS. 5A and 5B each show a schematic side view of a semiconductor chip 1 according to an embodiment.

The semiconductor chip 1 of FIG. 5A has a carrier 16 on which an n-contact 5 is arranged. A p-contact 6 is arranged above the n-contact 5. The semiconductor chip 1 further comprises a semiconductor layer sequence comprising at least one p-doped semiconductor layer, at least one n-doped semiconductor layer, and an active region. The n-contact 5 extends up to the n-doped semiconductor layer and thus electrically contacts it. The p-contact 6 electrically contacts the p-doped semiconductor layer 12.

FIG. 5B shows a schematic side view of a so-called flip chip. This means that the contacts 5, 6 are arranged on the same side of the semiconductor chip 1. The semiconductor chip 1 can be arranged on a carrier 16. The arrangements described in FIGS. 5A and 5B can also have the solder layer 10 and the seed layer 4 according to the above embodiments and are applicable accordingly.

The exemplary embodiments described in connection with the Figures and their features can also be combined with one another according to further exemplary embodiments, even if such combinations are not explicitly shown in the Figures. Furthermore, the exemplary embodiments described in connection with the Figures can have additional or alternative features as described in the general part.

The invention is not limited by the description using the exemplary embodiments of these. Rather, the invention includes any new feature, as well as any combination of features, which in particular includes any combination of features in the claims, even if that feature or combination itself is not explicitly stated in the claims and exemplary embodiments.

The invention claimed is:

1. A method for producing an optoelectronic component, the method comprising:
    providing a semiconductor chip having an active region for radiation emission;
    applying a seed layer on the semiconductor chip, wherein the seed layer comprises a first metal and a second metal being different from the first metal, and wherein the second metal is less noble than the first metal;
    applying a structured photoresist layer directly to the seed layer; and
    applying a solder layer at least to regions of the seed layer which are not covered by the photoresist layer,
    wherein a ratio of the first metal to the second metal in the seed layer is between 95:5 to 99:1.

2. The method according to claim 1, further comprising tempering the seed layer.

3. The method according to claim 1, further comprising removing the photoresist layer with a lift-off method.

4. The method according to claim 1, further comprising removing the regions of the seed layer not covered by the photoresist layer by wet chemical etching.

5. The method according to claim 1, wherein a region between the photoresist layer and the seed layer is free of a nitride layer for adhesion promotion.

6. The method according to claim 1, wherein the seed layer is free of titanium.

7. The method according to claim 1, wherein the first metal is gold, silver, platinum or copper.

8. The method according to claim 1, wherein the second metal is zinc, tin or aluminum.

9. The method according to claim 1, wherein the first metal is gold and the second metal is zinc.

10. The method according to claim 1, wherein a proportion of the second metal in the seed layer is between 0.5 wt % and 10 wt %.

11. The method according to claim 1, wherein the seed layer has a layer thickness between 50 nm and 5000 nm.

12. The method according to claim 1, wherein the solder layer comprises a metal which is electrodeposited and corresponds to the first metal of the seed layer.

13. An optoelectronic component comprising:
    a semiconductor chip comprising an active region configured to emit radiation;
    a structured seed layer comprising a first metal and a second metal being different from the first metal, wherein the second metal is less noble than the first metal, and wherein the seed layer is arranged on the semiconductor chip; and
    a solder layer arranged directly on the seed layer,
    wherein a ratio of the first metal to the second metal in the seed layer is between 95:5 to 99:1.

14. The optoelectronic component according to claim 13, wherein the solder layer comprises the first metal.

15. The optoelectronic component according to claim 13, wherein the solder layer comprises the first metal and tin.

\* \* \* \* \*